United States Patent [19]
Kaufman et al.

[11] Patent Number: 5,663,645
[45] Date of Patent: Sep. 2, 1997

[54] SPATIALLY ORTHOGONAL RECTANGULAR COIL PAIR SUITABLE FOR VERTICAL MAGNETIC FIELD MRI SYSTEM

[75] Inventors: Leon Kaufman, San Francisco; Joseph W. Carlson, Kensington; Barry McCarten, Palo Alto; Stephen Krasnor, Berkeley; William K. M. Lu, San Francisco; Mitsuaki Arakawa, Hillsborough; Kevin A. Derby, San Bruno, all of Calif.

[73] Assignee: Toshiba America MRI Inc., Tustin, Calif.

[21] Appl. No.: 520,748

[22] Filed: Aug. 29, 1995

Related U.S. Application Data

[63] Continuation-in-part of Ser. No. 285,008, Aug. 2, 1994, abandoned.

[51] Int. Cl.[6] ............................................. G01V 3/00
[52] U.S. Cl. ............................................. 324/318; 128/653.5
[58] Field of Search ........................ 324/322, 318, 324/314, 312, 307, 309; 128/653.5

[56] References Cited

U.S. PATENT DOCUMENTS

| | | | |
|---|---|---|---|
| 4,728,896 | 3/1988 | Bendall et al. | 324/318 |
| 4,766,383 | 8/1988 | Fox et al. | 324/318 |
| 4,784,146 | 11/1988 | Mancuso et al. | 324/322 |
| 4,918,388 | 4/1990 | Mehdizadeh et al. | 324/322 |
| 4,956,609 | 9/1990 | Miyajima | 324/318 |
| 4,968,937 | 11/1990 | Akgun | 324/318 |
| 5,003,276 | 3/1991 | Sarwinski et al. | 335/304 |
| 5,134,374 | 7/1992 | Breneman et al. | 324/319 |
| 5,144,241 | 9/1992 | Oppelt et al. | 324/318 |
| 5,185,577 | 2/1993 | Minemura | 324/318 |
| 5,241,272 | 8/1993 | Friedrich | 324/318 |
| 5,245,286 | 9/1993 | Carlson et al. | 324/319 |
| 5,270,656 | 12/1993 | Roberts et al. | 324/322 |
| 5,370,118 | 12/1994 | Vij et al. | 324/322 |
| 5,457,386 | 10/1995 | Matsunaga et al. | 324/318 |
| 5,467,017 | 11/1995 | Duerr et al. | 324/318 |
| 5,510,714 | 4/1996 | Takahashi et al. | 324/318 |
| 5,517,120 | 5/1996 | Misic et al. | 324/322 |
| 5,539,314 | 7/1996 | Arakawa et al. | 324/318 |

*Primary Examiner*—Louis M. Arana
*Attorney, Agent, or Firm*—Nixon & Vanderhye P.C.

[57] ABSTRACT

A nuclear magnetic resonance imaging system is described. The nuclear magnetic resonance imaging system includes an RF transmit device formed as two rectangular coils arranged in planes orthogonal to one another and formed by two U-shaped loops. The U-shaped loops improve $B_1$ field homogeneity in the vertical direction. The rectangular coils may be used in a four post MRI device to improve access to the body being imaged.

18 Claims, 10 Drawing Sheets

SPATIALLY ORTHOGONAL RECTANGULAR COIL PAIR SUITABLE FOR VERTICAL MAGNETIC FIELD MRI SYSTEM

This is a continuation-in-part of our earlier, application Ser. No. 08/285,008 filed on Aug. 2, 1994 now abandoned.

FIELD OF THE INVENTION

This invention relates to Magnetic Resonance Imaging (MRI). In particular, this invention relates to apparatus and methods for generating RF fields during a MRI procedure.

BACKGROUND OF THE INVENTION

As is now well known, in MRI, a body to be imaged (such as a human body) is placed in a static magnetic field such that, for a selected region of the body, the polarities of certain nuclei in the body tend to align in the direction of the magnetic field. By imposing a gradient magnetic field across the body and then applying an RF field at the Larmor frequency, selected nuclei can be tipped over from their magnetically aligned position into a position 90 or 180 degrees off of alignment. Removing the RF transmission signal causes the selected nuclei to realign. During the realignment, the nuclei generate RF signals that can be detected by an RF receiving coil. The resulting RF signals received by the RF receiving coil are processed to derive a cross-sectional image of a portion of the body such as a head, spine, etc.

In MRI devices, several apparatus and methods have been devised to create both the static magnetic field and the RF field. The static magnetic field, for example, has been created using both tubular coils, (where the body is passed inside a tube), and transverse magnets, (where the body is positioned between opposing pancake-like magnets). The transverse magnet arrangements have been commonly referred to by the type of structure that supports the transverse magnets, such as "C", "H", and "Four Post" arrangements. These transverse magnet arrangements are beneficial over tubular coil arrangement in that they provide improved access to the body during the imaging procedure. This can be advantageous, for example, when the person being imaged needs to be physically accessible to receive medical treatment during the MRI process.

The RF field must also be created during the MRI process and is commonly done so by a set of coils disposed within the MRI device. One such arrangement provides saddle-shaped coils or solenoids arranged around the body being imaged. The saddle-shaped coils or solenoids produce RF fields in manners well known in the art. These arrangements, however, are problematic since they restrict the access to the body being imaged. This deficiency is especially exemplified in transverse magnet systems where the open access that is gained by the transverse magnets (for the static field) would be at least partially lost by the presence of the saddle-shaped coil or solenoid (for the RF field) that may be close to and around the body being imaged.

An RF antenna that provides improved access to the body is disclosed in Akgun, U.S. Pat. No. 4,968,937. Akgun discloses an RF antenna in the form of two sheets of conductive strips that are arranged on opposite sides of the body being imaged. Additional sheets, providing a return current path for the conducting strips, are arranged in composite with the conducting strip sheets. In operation, Akgun describes the current passing through the strips as causing the sheets to act as transmission lines that are tuned to a desired resonance frequency by a tuning network.

While the Akgun arrangement provides improved accessibility to the patient during the MRI procedure, it suffers from problems with complexity that are associated with the current conducting strips on the composite sheets. The composite of conductive sheets with strips and return paths is believed to disadvantageously increase manufacturing cost. In addition, homogeneity of the RF field may be reduced if current carried through the respective conductive strips is not carefully controlled.

Another RF transmitter arrangement is described in McCarten, et al., commonly assigned U.S. application Ser. No. 08/025,418. McCarten discloses an RF coil formed of flat conductor lengths that make serially-connected, oppositely directed turns. The conductor lengths are arranged near the static field magnets on opposite sides of the patient. In particular, the conductor lengths are formed in annular depressions created by the magnetic shims associated with the static field magnets. In this arrangement, the RF coils do not add any extra obstacle to physically accessing the patient during the MRI procedure.

Due to the configuration and location of the conductor lengths in the McCarten RF coil, the McCarten device, however, requires considerable RF power at the transmitter in order to tip the selected magnetically aligned nuclei in the body.

An RF transmitter that provides good access to the patient, operates at lower power levels is desirable.

SUMMARY OF THE INVENTION

In an example embodiment of the present invention, an RF coil pair is used in conjunction with the so-called "Four-Post" transverse magnet imager. In this MRI structure, four magnet posts are provided at respective corners of the imaging structure to support opposing transverse magnets and to provide a return flux path for the static magnetic field. The four "posts" support the transverse magnets respectively above and below the body being imaged. In an example embodiment of the present invention, the RF coils of the present invention are formed in orthogonal planes diagonally across the imaging area, between the four magnet posts.

Specifically, in one embodiment, the RF coil pairs form two or more generally rectangular loops around the body being imaged. Each loop begins at a matching network, extends along and near one of the four magnet posts, extends toward the opposite corner of the imager near the upper transverse magnet structure, extends along and near the opposite corner magnet post, and returns to the original magnet post near the lower transverse magnet structure. The RF coils thus form two continuous RF conductor paths around the body being imaged, and can be used for quadrature detection (QD).

Another embodiment of the present invention, which has particular application in the non-QD mode, provides two orthogonal rectangular coils formed from a single contiguous conductive strip. In this embodiment, the contiguous strip begins at one post; extends down to the lower transverse magnet structure; turns 90° (toward an adjacent post) when it reaches approximately the center of the lower transverse magnet structure; follows the adjacent post up to the upper transverse magnet structure; extends across the upper magnet structure to and down the opposite post; and finally extends back to the center of the lower transverse magnet structure; turns 90° toward the remaining post; extends up the remaining post and across the upper transverse magnet to the original starting post. In this manner, two rectangular loops are formed by a contiguous conductive strip running between the oppositely disposed pairs of posts.

In each embodiment, the present RF coil pair provides a compact structure that permits access to the patient during the imaging process while reducing RF transmission power requirements. The present RF coils also produce good RF field homogeneity at relatively low power levels.

BRIEF DESCRIPTION OF THE DRAWINGS

The purpose and advantages gained by the present invention will be understood by careful study of the following detailed description of the presently preferred embodiment with particular reference to the accompanying drawings.

DETAILED DESCRIPTION OF THE PRESENTLY PREFERRED EMBODIMENT

Figure 1:
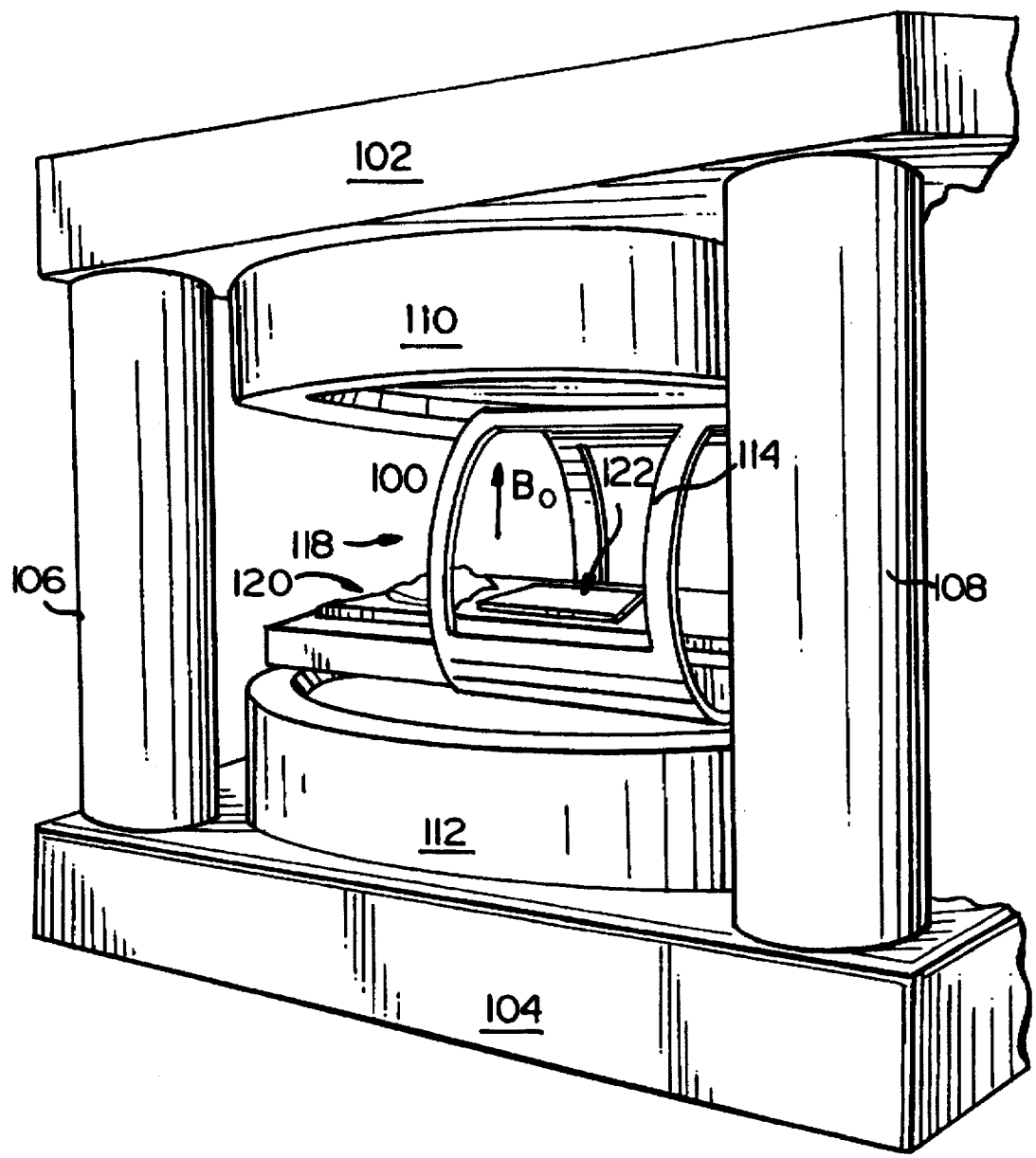
FIG. 1 is an isometric view of a known four post MRI.

FIG. 1 is a so-called four post transverse MRI system. To create the static magnetic field in this system, massive magnetically permeable structures including blocks 102 and 104 interconnected by magnet posts 106 and 108 define flux paths between permanent magnets (or electromagnets) having an upper transverse pole 110 and a lower transverse pole 112. A patient is conveniently moved into and out of the image volume 118 via patient bed 120.

As can be seen in FIG. 1, the structure associated with the static magnetic field provides a relatively open and accessible image volume 118. The poles 110 and 112 only occupy space respectively above and below the bed 120 and the posts 106 and 108 only occupy space at the corners of the bed 120. Access to the patient on the bed 120 during the MRI procedure is thus not significantly hampered by the static magnet structures.

In the prior art device of FIG. 1, access to the patient is hampered, however, by the RF transmission coil structures. Specifically, in prior art systems like that shown in FIG. 1, a relatively large RF transmit coil 100 is typically utilized. As those in the art will appreciate, after the nuclei in the body have become magnetically aligned by the magnetic field Bo, the RF transmit coil must generate relatively high powered RF pulses to tip the nuclei 90 or 180 degrees during the MRI process. During this process, obtaining substantially uniform transmit RF field distribution is desirable. In prior art devices, relatively large saddle-shaped coils or solenoids have been utilized as the RF transmitters to create that RF field distribution. As shown in FIG. 1, the saddle-shaped coils can present relatively large and obstructive structures around the body during the MRI procedure. This is true even though apertures 114 may be formed in the RF transmit coil 100 to improve access to the body during the MRI procedure.

Producing good RF field homogeneity and sensitivity without the RF coil 100 surrounding the patient in the MRI device of FIG. 1 is desirable.

To complete the RF system in FIG. 1, a relatively small, RF receiver coil 122 typically is coupled to the relevant patient anatomy within the imaging volume to receive relatively weak RF response signals. The receive coil 122 depicted in FIG. 1 is especially adapted for imaging portions of the spine and is incorporated within a patient support pad. Other RF receive coils of any desired configuration for use with a transverse magnet MRI system can be used in conjunction with the RF transmission coils of this invention.

Figure 2:
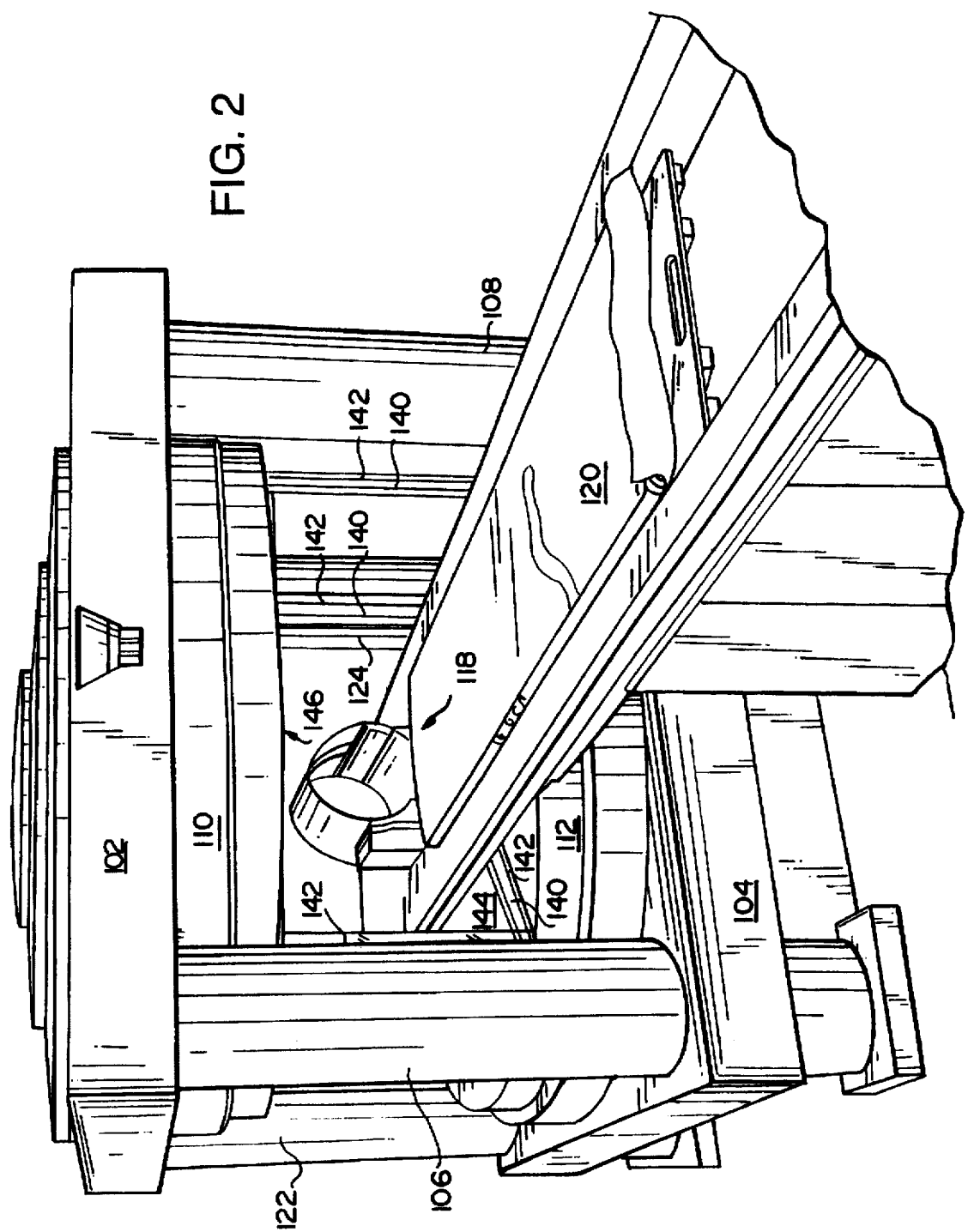
FIG. 2 is an isometric view of a four poster bed MRI in accordance with a first embodiment of the present invention.

The Four-Post MRI structure of FIG. 2 is similar to FIG. 1 except that the RF transmission coils in FIG. 2 are arranged in a so-called "X-wing" arrangement.

As can be seen in FIG. 2, the imaging volume 118 is not restricted by the RF transmission coil 100 of the prior art (FIG. 1) four post transverse magnet MRI structure. Instead, in the MRI system of FIG. 2, the RF transmission coils are in copper strips 140, which are formed as two loops extending between respectively opposing posts 108/122 and 106/124.

Specifically, the first RF transmission loop is formed by the copper strip 140 extending vertically inside of and near to the post 108. It continues along its respective ends near the faces 144 and 146 of the lower pole 112 and upper pole 110, respectively. The loop is completed near the pole 122 by extending vertically inside of and near to the pole 122, in a fashion similar to that shown with respect to pole 108.

A second RF transmission loop is formed by the copper strip 140 rising vertically near to and inside of posts 106 and 124 and rising horizontally near to and inside of faces 144 and 146. Since FIG. 2 is drawn in isometric view, only certain portions of the two loops of copper strip 140 can be seen, but it will be appreciated that the copper strips form two loops between respectively opposing posts, as can be more particularly seen in FIG. 3.

Figure 3:
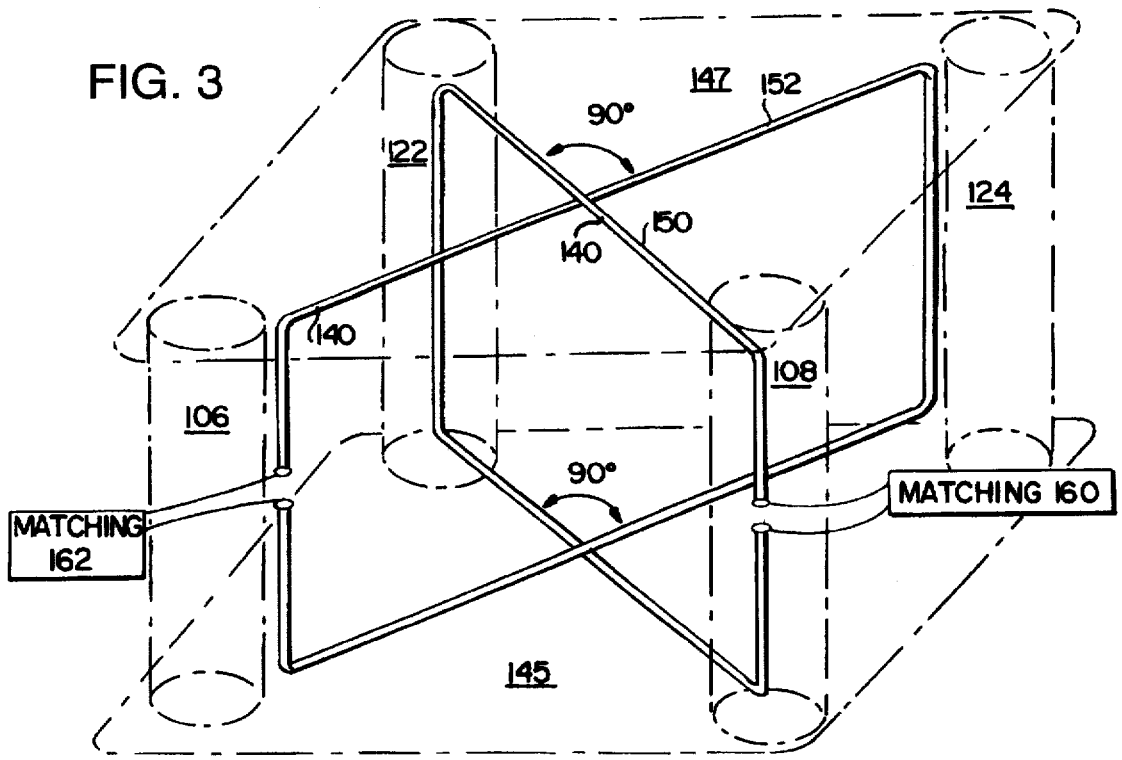
FIG. 3 is a simplified isometric view of the RF coils on the MRI of FIG. 2.

In FIG. 3, the posts 106, 108, 122, and 124, (which are also shown in FIG. 2), are shown in dashed lines. In addition, the faces 144 and 146 (FIG. 2) generally correspond with the planes 145 and 147 (FIG. 3), respectively. The system shown in FIG. 3 is the same as that shown in FIG. 2, except that structures other than the two RF transmission loops 150 and 152, formed of the conductive strips 140, are hidden or shown in dashed lines.

As can be seen in FIG. 3, a first RF transmission loop 150 extends between poles 108 and 122. A second RF transmission loop 152 extends between posts 106 and 124. The two loops 150 and 152 are composed of conductive strips 140. The conductive strips open at a convenient place along their length to electrically connect to a matching circuit 160/162. The first and second loops 150 and 152 are preferably, though not necessarily, set in planes that are 90 degrees to one another, as shown in FIG. 3. The loops 150 and 152 may be at any angle relative to each other from 0° to 180° in non-QD mode.

Figure 4:
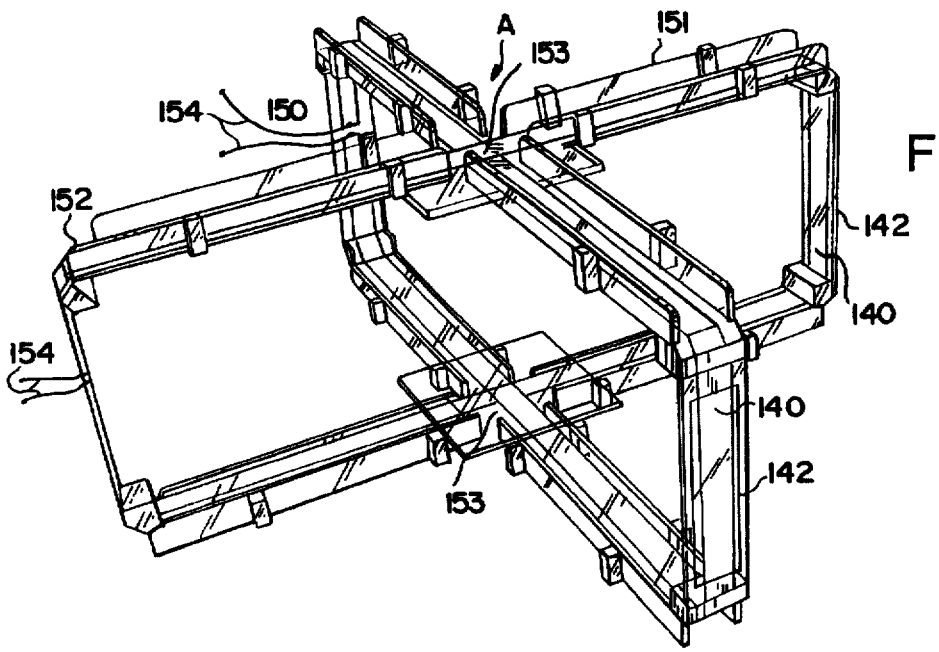
FIG. 4 is an isometric view of the RF coils in a first embodiment of the present invention.

FIG. 4 shows the actual structure of an example embodiment of the RF transmission coils of the present invention. In FIG. 4, the conductive strips 140 forming the two loops 150 and 152 can be seen encased in a clear polymer material 142. Appropriate mounting structures 151, that mount the two loops 150 and 152 in the imaging area 118 (FIG. 2), will be provided to secure the loops 150 and 152 to the particular MRI structure.

The loops 150 and 152 each include leads 154 to connect the matching circuits 160 and 162.

In the example embodiment, the coils 150 and 152 are identical rectangular coil loops disposed 90° to each other. The general dimension of each rectangular loop is 55 inches long and 19.5 inches tall. The conductive strip width is 2 inches. The conductive strip is composed of thin copper but may be other conducting material and may be thicker provided its thickness does not significantly inhibit access to the imaging volume.

Figure 5:
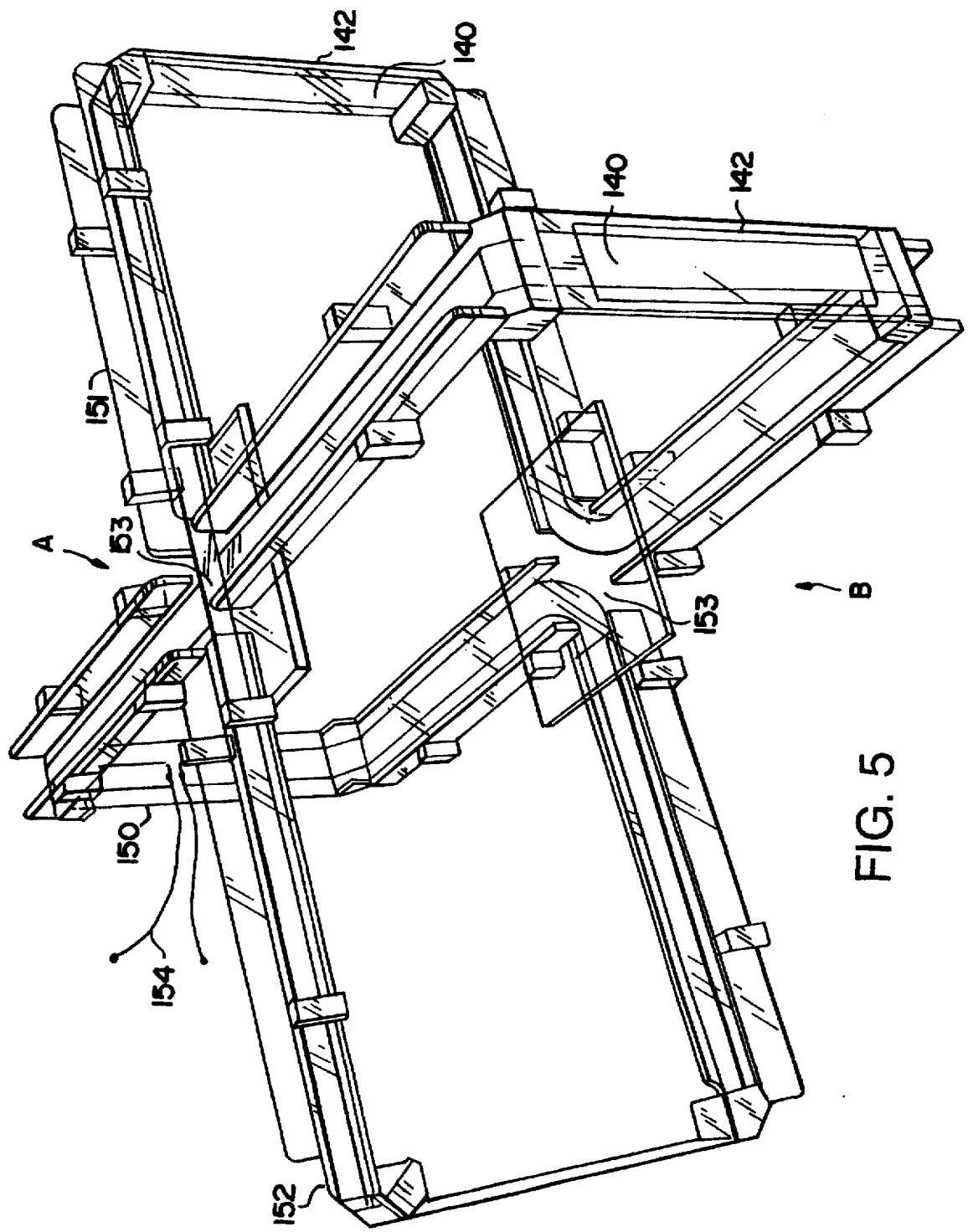
FIG. 5 is an isometric view of the RF coils in a second embodiment of the present invention.

FIG. 5 shows another embodiment of the present invention in which the two loops 150 and 152 are formed from a single, contiguous conductive strip 140. FIG. 5 is similar in all respects to FIG. 4 except that the embodiment of FIG. 5 has only one crossing point (in the direction "A") and one set of leads 154, where the embodiment of FIG. 4 has two crossing points and two sets of leads 154.

In the direction "B" of FIG. 5, the conductive strips 140 of the loops 150 and 152 pass each other without touching or crossing over one another, as is described in greater detail below with respect to FIG. 7.

Figure 6:
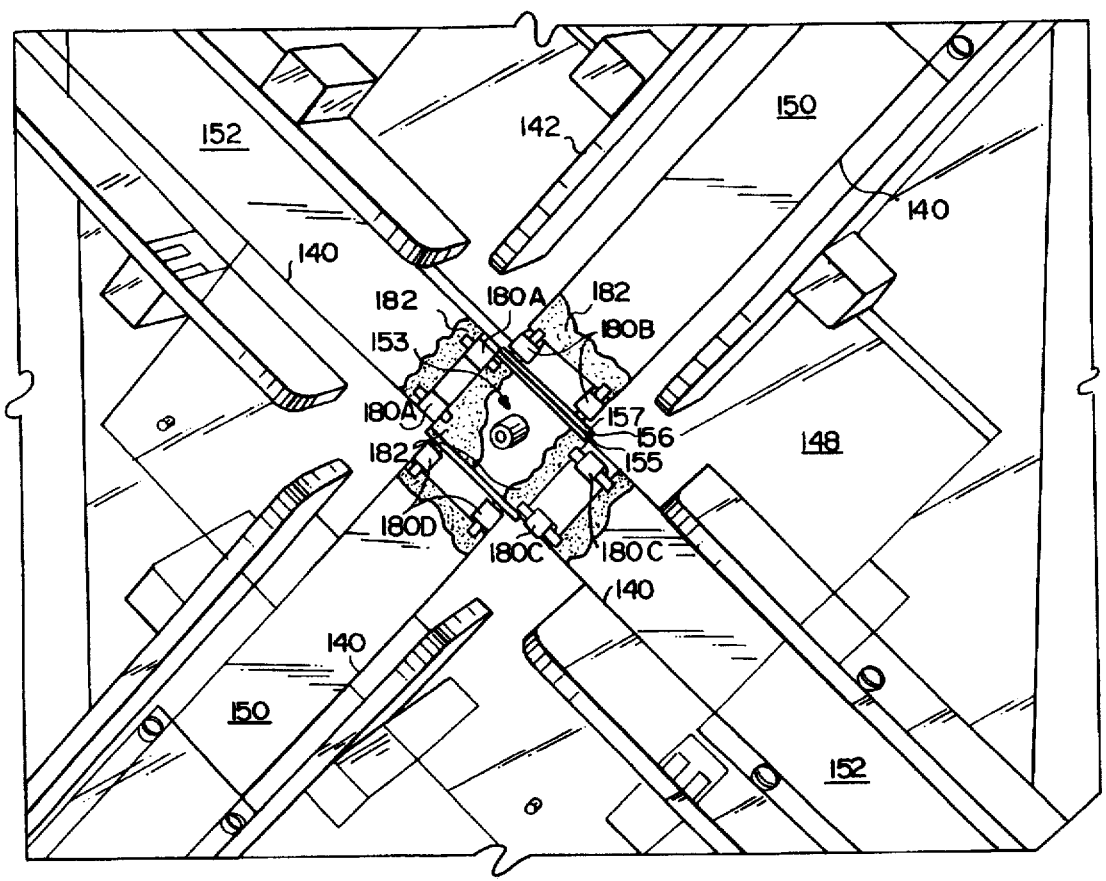
FIG. 6 is a view of a portion of the RF coils shown in FIG. 4 viewed in the direction "A" of FIGS. 4 and 5.

FIG. 6 shows one of the crossing points 153 of the respective loops 150 and 152 taken from the view "A" of FIGS. 4 or 5. In the embodiment of FIG. 4, the loops 150 and 152 will have two crossing points as can be seen in FIG. 4. While only one such crossing point is described here, the description applies equally to each crossing point. The embodiment of FIG. 5 will have one crossing point like that shown in FIG. 6.

Looking first at loop 152 in the top left corner of FIG. 6, the conductive strip 140 approaches the crossing point 153 and terminates in two capacitors 180A electrically attached to the conductive strip 140 by solder 182. The capacitors 180A are then electrically attached by solder 182 to one end of a top conductive layer 155. At the opposite end of the top conductive layer 155, capacitors 180C are electrically attached by solder 182. The capacitors 180C are then electrically connected by solder to the conductive strip 140 of the loop 152. The conductive strip 140 then continues toward the lower right corner of FIG. 6. Thus, the loop 152 shown in FIG. 6 is electrically contiguous from the top left corner of FIG. 6 to the bottom right corner of FIG. 6 via the series connection of conductive strip 140, capacitors 180A, top conductive layer 155, capacitors 180C, and conductive strip 140.

The top conductive layer 155 forms the top half of a sandwich of two conductive layers, 155 and 157. The top conductive layer 155 is separated from the bottom conductive layer 157 by a thin teflon piece 156. The bottom conductive layer 157 forms the electrical crossing point for loop 150 in the same way that the top conductive layer 155 formed the electrical crossing point for loop 152 described above. Specifically, the loop 150 is electrically contiguous from the top right corner of FIG. 6 to the bottom left corner of FIG. 6 by the series connection of the conductive strip 140, the capacitors 180B, the bottom conductive layer 157, the capacitors 180D, and conductive strip 140.

The capacitors 180A–180D are low value capacitors to reduce the capacitive coupling between each rectangular coil. The inductance of each rectangular coil (a single turn) is approximately 2.5 µH. The coil is tuned to 15 MHz and matched to 50Ω via the matching circuits 160 and 162.

Alternatively, the capacitors can be placed in series anywhere along the length of the conductive strips 140, and may, for example, be placed at equal distances along the RF transmission coil loop (or loops).

In FIG. 4, the rectangular coils 150 and 152 are isolated magnetically (because the two coils are orthogonal to each other) as well as electrically. This makes them suitable for a quadrature transmit coil application. Alternatively, the two rectangular coils can be wired either in series or in parallel to form a non-quadrature transmit coil arrangement, such as is shown in FIG. 5. The advantage of the quadrature transmit coil arrangement is the saving of RF transmit power by a factor of 2. The disadvantage of the quadrature coil configuration is the requirement that the isolation between the coils be maintained. Both the quadrature and non-quadrature applications are envisioned within the scope of this invention, with the non-quadrature transmit coil being simpler in electrical circuitry with less coupling required, but requiring more RF power.

Figure 7:
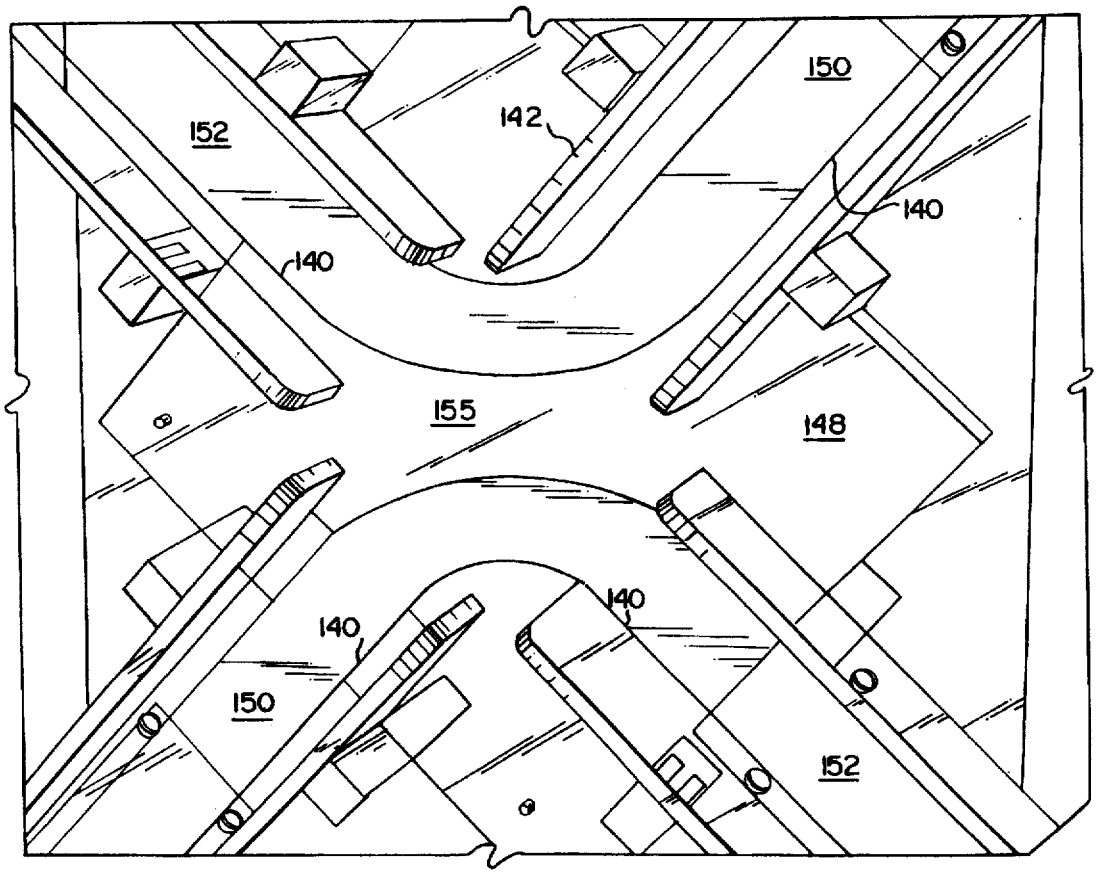
FIG. 7 is a view of a portion of the RF coils shown in FIG. 5 viewed in the direction "B" of FIG. 5.

FIG. 7 shows the transition point "B" from FIG. 5. Beginning in the top left corner of FIG. 7, the conductive strip 140 starts as loop 152 then turns near the center point 155 into loop 150 in the top right corner of FIG. 7. The conductive strip of the loop 150 (from the top right corner of FIG. 7) then loops into the paper of FIG. 7 until it emerges at the lower left corner of FIG. 7. From there, the conductive strip 140 turns to form the portion of loop 152 at the lower right corner of FIG. 7. The conductive strip 140 again loops into the paper of FIG. 7 and emerges at the upper left corner of FIG. 7.

Figure 8:
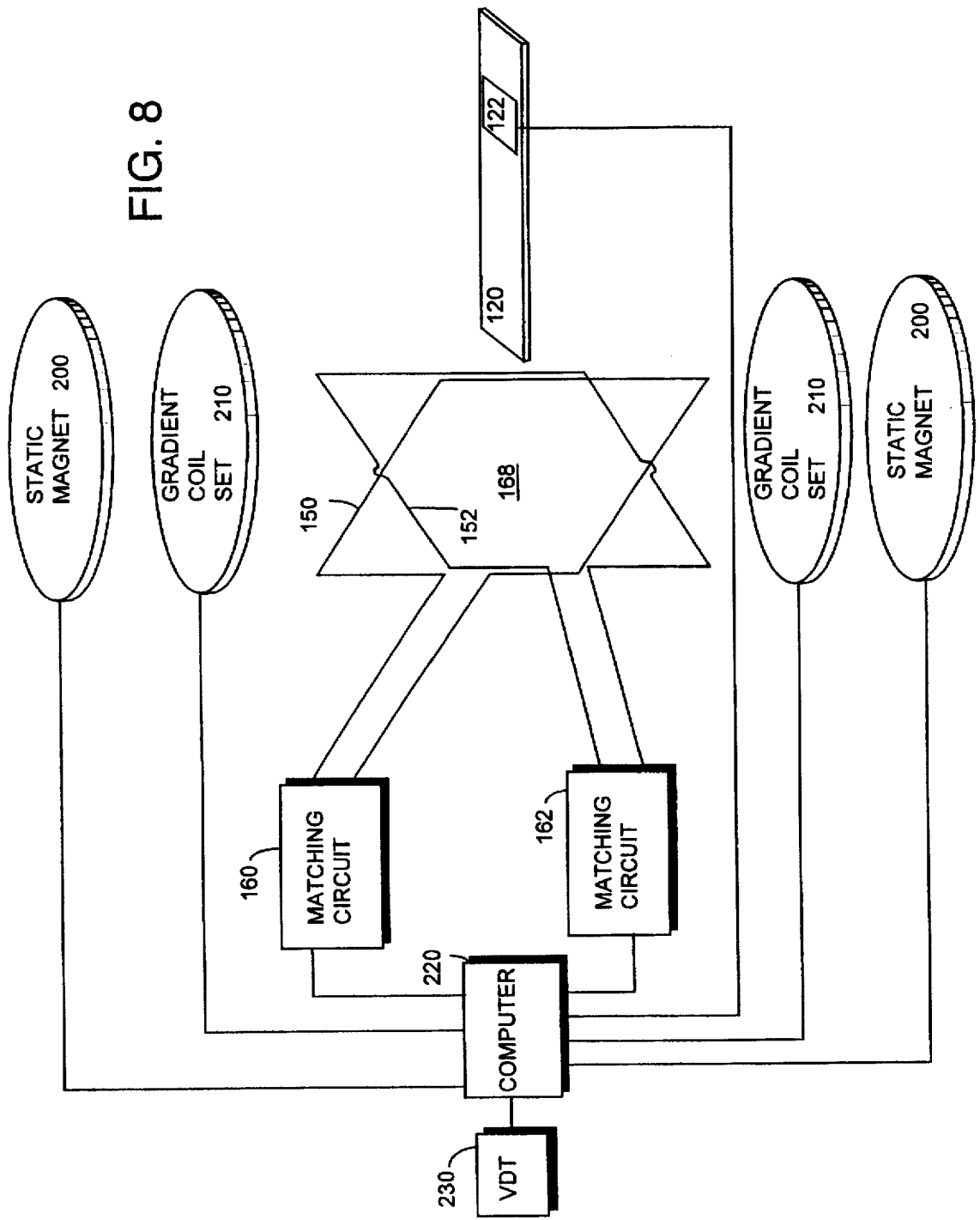
FIG. 8 is a combined schematic and isometric view of an MRI according to the embodiment of FIG. 4.

FIG. 8 shows the present MRI system with the X-wing RF transmission coils according to the embodiment of FIG. 4. Specifically, the Table 120 (reference FIG. 2) is shown about to enter the image volume 168 between static magnets 200, gradient magnets 210, and RF transmission coil loops 150 and 152. The loops 150 and 152 in this example embodiment are arranged to transmit RF signals, while a RF receiving coil 122 is arranged to receive the reflected RF signals. The loops 150 and 152 are attached to respective matching circuits 160 and 162. The static magnets 200, gradient magnets 210, loops 150 and 152, and RF receiving coil 122 are all electrically connected to a computer 220 which controls the creation and reception of the various RF fields. The computer 220 is then connected to the video display tube 230 to provide a visual image of the imaged area.

Figure 9:
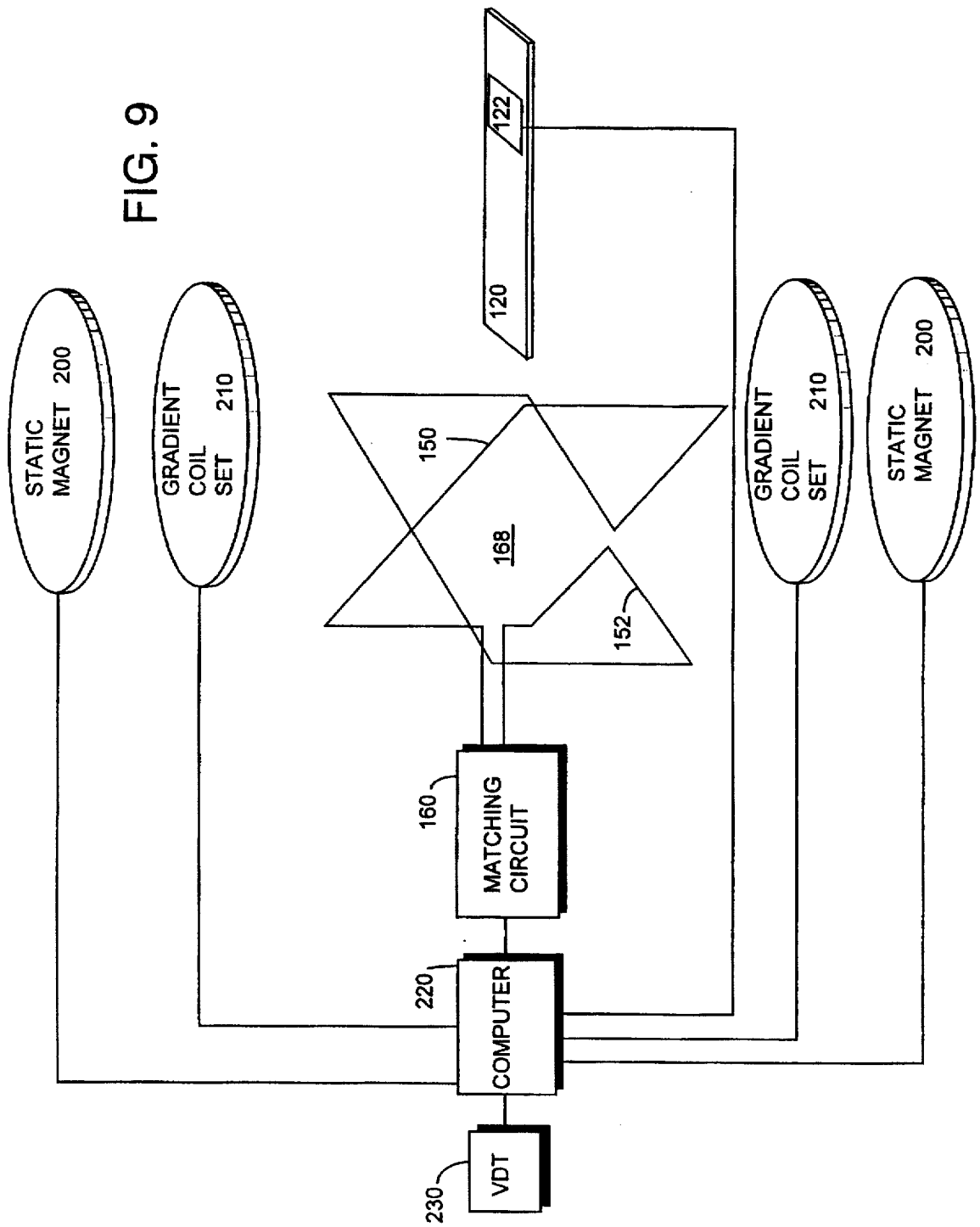
FIG. 9 is a combined schematic and isometric view of an MRI according to the embodiment of FIG. 5.

FIG. 9 is similar to FIG. 8, except that the RF transmission coils 150 and 152 correspond to the coils shown in FIG. 5, rather than FIG. 4. FIG. 9, like FIG. 8, includes a bed 120 entering an imaging volume 168 defined by the loops 150/152, the gradient coils 210 and the static magnets 200.

The X-wing coils of the present invention offer advantages over prior RF coils, because the X-wing coils offer less restricted access to the subject being imaged. For regular and interventional imaging uses, the X-wing coil will provide virtually the same openness to the patient being imaged as that of the flat cross-sectional transmit coil described in U.S. application Ser. No. 08/025,418 (described above).

The X-wing coil also has advantages over the RF flat cross-sectional transmit coil in terms of RF power efficiency. Specifically, RF power efficiency is defined as the RF field strength B divided by the RF power input required to obtain the RF field strength. The X-wing coil requires one tenth of the RF power for the same flip angle, compared with that of the flat cross-sectional transmit coil at the same operational frequency.

If you compare, for example, the McCarten (U.S. application Ser. No. 08/025,418) RF transmit coil that is provided as a pancake-like coil near the upper and lower transverse magnet structures with the X-wing transmit coils of the present invention, the advantages in terms of power efficiency gained by the present invention are demonstrated. The McCarten pancake-like transmit coils, for example, at 2.74 MHz, need approximately 3 kW of transmit power to achieve reasonable uniformity of the transmission field. Since power requirements are proportional to the frequency used, if the McCarten device goes to 15 MHz, the transmission coils would require approximately 20 kW of power. These power requirements can be reduced by half if the McCarten pancake-like transmit coils are operated in a QD mode, yielding a power requirement of 10 kW at 15 MHz. This is still relatively high.

By comparison, the X-wing coils of the present invention, in non-QD mode and at 2.74 MHz, require only approximately 300 watts of power to achieve the same uniformity of the transmission field as the McCarten pancake-like transmission coils. The 300 watts for the present X-wing transmit coil compares to the 3000 watts required by the McCarten device.

Figure 10:
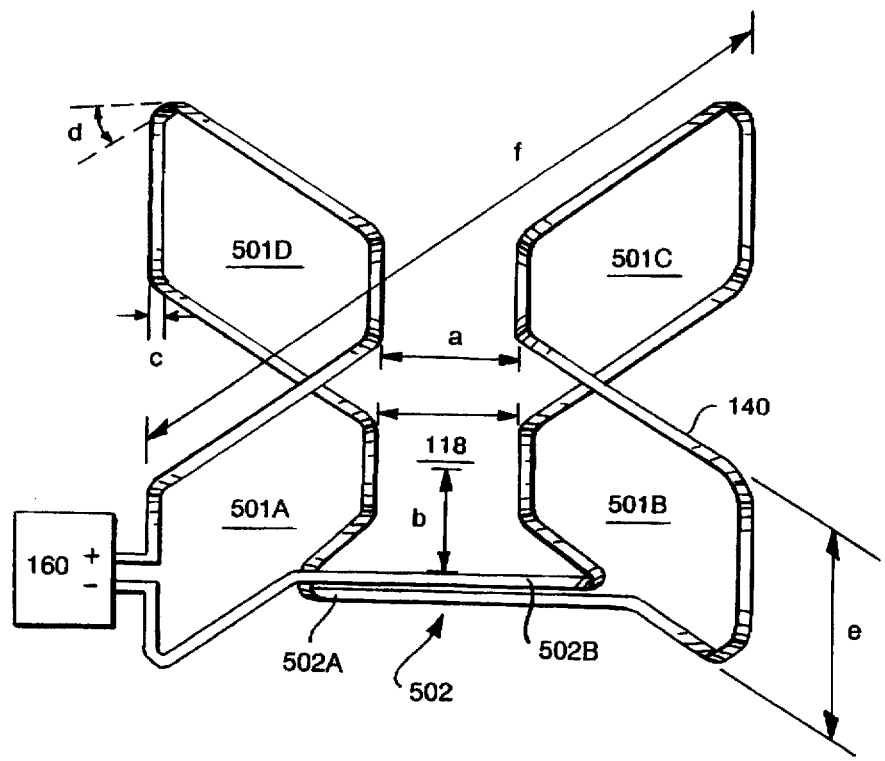
FIG. 10 is an isometric view of an alternative embodiment of the RF coils according to the present invention.
Figure 11:
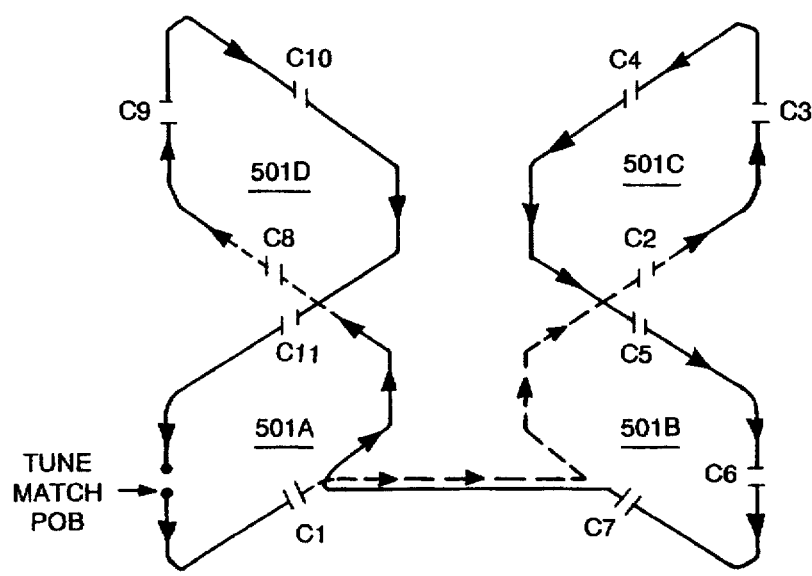
FIG. 11 is a schematic view of the embodiment of FIG. 10 showing in more detail the RF current and distributed capacitors.
Figure 12:
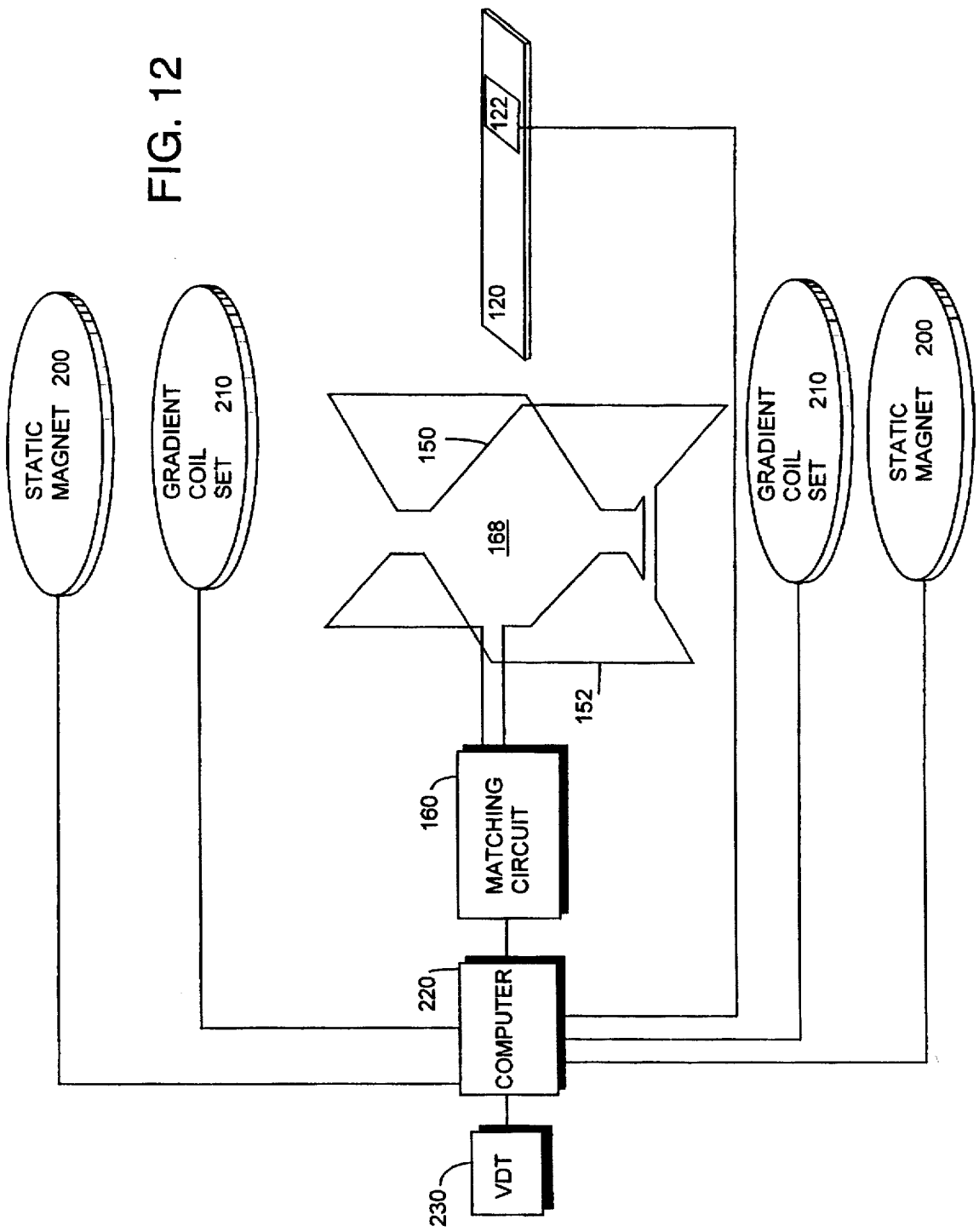
FIG. 12 is a combined schematic and isometric view of an MRI according to the embodiment of FIG. 9.

FIGS. 10–12 illustrate further embodiments of the present invention which improve the magnetic field uniformity in the vertical direction at the coil center. The improvement of FIGS. 10–12 corrects vertical field inhomogeneity that exists in the coils of FIGS. 2–8.

The X-wing coil of a type shown in FIG. 3, for example, when installed in a MRI system exhibited a $B_1$ field strength increase of 70% to 100% at a location 15 cm vertically above the center of the X-wing coil, as compared to the $B_1$ field strength directly at the center of the coil. This vertical inhomogeneity exists equally when comparing a like location in the X-wing coil below the center of the coil. By comparison, the X-wing coil of FIGS. 10–12 exhibits only a 12% to 15% increase in $B_1$ field strength when comparing the field at the center versus 15 cm above/below the center. The coil of FIGS. 9–12 thus provides improved $B_1$ homogeneity in the vertical direction.

The increased inhomogeneity of the $B_1$ field in the vertical direction is likely due to the stronger magnetic field that is generated by the cross-over point "A," in the respective coils, as shown in FIG. 5. In the improved coil of FIGS. 9–12, the cross-over points are moved outwardly to locations where the strong magnetic fields that they generate have less ill-effect on the $B_1$ field homogeneity in the critical central portion of the imaging volume 118. Typically, the critical imaging area is 30 cm DSV. By moving the cross-over points out of this imaging area (or at least away from the center of it) the vertical $B_1$ field homogeneity is improved.

FIGS. 9–12 show the structure of the improved X-wing coils. In particular, the coils are created by two electrically contiguous "U"-shaped conductive loops (the loops are "U"-shaped as viewed from the top or bottom views of, for example, FIG. 9). The strips are in all ways like those described with respect to FIGS. 3–7 with the exception of the way they bend to form the "X-wing" configuration. That is, for example, in FIG. 5, the "Xs" in the X-wing are formed by two overlooping loops formed (from the top view) as a "/" loop overlapping a "\" loop while those of FIG. 5 are formed as a ">" loop side by side with "<" loop. In either case, the result is an "X" configuration. The resulting X-wing coil of FIGS. 9–12 are also similarly situated, similarly mounted and similarly used in the MRI system as the X-wing coils described with respect to FIGS. 3–7.

The term "U-shaped loop" means a generally rectangular loop that is bent, rounded, or deviated near its middle to an angle less than 180° (viewed from the top or bottom view), regardless of the degree of curvature, and regardless of the smoothness, symmetry squareness or "pointedness" of the resultant curve. Thus, U-shaped would include shaped loops and less regular loops. In addition, the "generally rectangular loop" need not be exactly rectangular, but may include, for example corner truncations "d" (FIG. 10) of 45°.

In the X-wing coil of FIG. 10, a generally continuous conductive strip 140 forms four half-loops 501A–D, with each half-loop extending outwardly from the central portion of the imaging volume 118. As shown in FIG. 10, half-loops 501A and 501D connect to form a "U" shaped full-loop, as do half-loops 501B and 501C. In one embodiment, the loops 501A/D and 501B/C can be situated so loop 501A/D extends generally from one post of a four post MRI system to an adjacent post (such as posts 106 and 122 in FIG. 3), while loop 501B/C extends generally from and to the remaining two adjacent posts (such as posts 108 and 124 in FIG. 3). In other embodiments, the X-wing coil can be turned at some angle off of alignment with the posts.

The conductive strip 140 generally begins at a matching circuit 160 at a (+) terminal electrode. From there, it begins forming the loop 501A/D. When the loop 501A/D is nearly fully formed, the strip crosses over to the loop 501 B/C at a transition area 502. In the transition area, a portion 502A of the strip 502 crosses from loop 501A/D to loop 501B/C. After the strip forms loop 501B/C, a portion 502B retraces the path of strip 502A (preferably, though not necessarily, underneath portion 502A) to return and complete loop 501A/D before terminating at the (−) terminal of the matching circuit 160. Portions 502A and 502B are electrically insulated from each other.

The following are usable dimensions for the X-wing coil of FIG. 10, although the invention is not limited to the specific dimensions described:

a=170 mm
b=240 mm
c=25.4 mm
d=45°
e=495.3 mm
f=1409.7 mm

Although the strip 140 is described as being "continuous," the strip preferably is interrupted by distributed capacitors C1–C11, as shown in FIG. 11. The term "continuous" shall include strips with distributed capacitors. The capacitors C1–C11 are low value capacitors to reduce capacitive coupling between the RF loops. The arrows of FIG. 11 illustrate the direction of RF current flow: beginning from the matching circuit, proceeding through loop 501B/C, through loop 501A/D, and back to the matching circuit.

FIG. 12 is similar to FIG. 8, except that the RF transmission coils 150 and 152 correspond to the coils shown in FIG. 10, rather than FIG. 4. FIG. 12, like FIG. 8, includes a bed 120 entering an imaging volume 168 defined by the loops 150/152, the gradient coils 210 and the static magnets 200.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A system for magnetically imaging a body in an imaging volume, comprising:
   housings respectively above and below the imaging volume, including:
      a static field magnet having respective poles in the respective housings; and
      a gradient field coil;
   a RF transmission coil strip forming two U-shaped loops, each U-shaped loop being concave outwardly from the imaging volume and having two sides at locations generally defined by the respective housings and two half-loops each in different planes;
   four posts arranged as two respective sets of two adjacent posts, each half-loop having three sides, each of the half-loops having two sides generally defined by the respective housings, the remaining sides of the two half-loops that form one of the U-shaped loops are defined by corresponding ones of two adjacent posts, and the remaining sides of the other two half-loops that form the other of the U-shaped loops are defined by corresponding ones of the remaining two adjacent posts; and
   a computer for controlling the magnetic flux of the gradient field coil, and the RF transmission coil strip.

2. A system according to claim 1, wherein:
   the posts mechanically supporting the housings above and below the imaging volume, the posts comprised of magnetic flux conductive material.

3. A system for magnetically imaging a body in an imaging volume, comprising:
   housings respectively above and below the imaging volume, including:
      a static field magnet having respective poles in the respective housings; and
      a gradient field coil;
   RF transmission coils formed of a single electrically contiguous conductive strip around the imaging volume forming two U-shaped loops, the U-shaped loops arranged side-by-side in an "X-shape around the imaging volume and forming two half-loops in different planes;
   four posts arranged as two respective sets of two adjacent posts, each half-loop having three sides, each of the half-loops having two sides generally defined by the respective housings, the remaining sides of the two half-loops that form one of the U-shaped loops are defined by corresponding ones of two adjacent posts, and the remaining sides of the other two half-loops that form the other of the U-shaped loops are defined by corresponding ones of the remaining two adjacent posts; and
   a computer for controlling the magnetic flux of the gradient field coil, and the RF transmission coils.

4. A system according to claim 3, wherein:
   the posts mechanically support the housings above and below the imaging volume, the posts comprised of magnetic flux conductive material.

5. An RF transmission coil for use in a transverse magnet MRI system having an image volume generally defined by vertical posts and horizontal housings, comprising:
   a first conductive strip forming a rectangular loop having connected top, bottom and side strips, the top and bottom strips having a portion near the center of the image volume and two end portions each extending from the first portion near the center of the image volume outwardly in two different directions toward two different vertical posts; and
   a second conductive strip forming another rectangular loop also having connected top, bottom and side strips, the top and bottom strips also having a portion near the center of the image volume and two end portions extending from the portion near the image volume outwardly in two still further different directions toward two still further different vertical posts.

6. An RF transmission coil according to claim 5, wherein:
   the four different directions are mutually orthogonal in at least one plane.

7. An RF transmission coil according to claim 5, wherein:
   the rectangular loops are electrically contiguous via transition portions of additional conductive strip connecting the first and second conductive strips.

8. An RF transmission coil according to claim 5, wherein the transition portions are no less than 15 cm from a center point of the image volume.

9. An RF transmission coil according to claim 5, further including:
   an electrically insulative frame supporting all of the respective conductive strips.

10. A magnetic system, comprising:
    a static field magnet having an upper pole defining an upper plane and a lower pole defining a lower plane;
    a support structure mechanically connecting the upper and lower pole, the support structure comprising magnetically conductive material; and
    a first RF coil formed by two generally rectangular electrically connected half-loops each having respective sides near the upper plane, lower plane, and support structure,
    wherein one half-loop is in a first plane substantially perpendicular to the upper and lower plane and the other half-loop is in a second plane different from the first plane, but also substantially perpendicular to the upper and lower plane.

11. A magnetic system according to claim 10, further including:
    a second RF coil formed by two other generally rectangular electrically connected half-loops each having respective sides near the upper plane, lower plane, and support structure,
    wherein one of said other half-loops is in a third plane different from the first and second plane, but also substantially perpendicular to the upper and lower planes and the other of said other half-loops is in a fourth plane different from the first, second and third planes, but also substantially perpendicular to the upper and lower planes.

12. A magnetic system according to claim 11, wherein two of the first, second, third and fourth planes are all substantially perpendicular to the other two of the first, second, third and fourth planes.

13. A magnetic system according to claim 11, wherein the support structure includes four posts.

14. A magnetic system according to claim 13, wherein the first and third planes generally intersect two of the four posts and the second and fourth planes generally intersect the other two of the four posts.

15. A system for magnetically imaging a body in an imaging volume, comprising:

housings respectively above and below the imaging volume, including:

a static field magnet having respective poles in the respective housings; and a gradient field coil;

a single RF transmission coil strip forming two U-shaped loops, each said loop being U-shaped when viewed from either of said poles, each U-shaped loop being concave outwardly from the imaging volume and having two sides at locations generally defined by the respective housings; and a computer for controlling the magnetic flux of the gradient field coil, and the RF transmission coil strip.

16. A system according to claim 15, wherein each U-shaped loop has two half-loops each in different planes.

17. A system according to claim 15, further comprising:

posts mechanically supporting the housings above and below the imaging volume, the posts comprised of magnetic flux conductive material.

18. A system according to claim 16, further including four posts arranged as two respective sets of two adjacent posts, each half-loop having three sides, each of the half-loops having two sides generally defined by the respective housings, the remaining sides of the two half-loops that form one of the U-shaped loops are defined by corresponding ones of two adjacent posts, and the remaining sides of the other two half-loops that form the other of the U-shaped loops are defined by corresponding ones of the remaining two adjacent posts.

* * * * *